(12) United States Patent
Liardet et al.

(10) Patent No.: US 7,734,672 B2
(45) Date of Patent: Jun. 8, 2010

(54) CHECKING OF A BIT FLOW

(75) Inventors: Pierre-Yvan Liardet, Peynier (FR); Yannick Teglia, Marseilles (FR)

(73) Assignee: STMicroelectronics S.A., Montrouge (FR)

( * ) Notice: Subject to any disclaimer, the term of this patent is extended or adjusted under 35 U.S.C. 154(b) by 979 days.

(21) Appl. No.: 11/166,565

(22) Filed: Jun. 24, 2005

(65) Prior Publication Data

US 2005/0288925 A1 Dec. 29, 2005

(30) Foreign Application Priority Data

Jun. 24, 2004 (FR) .................................. 04 51325

(51) Int. Cl.
*G06F 1/02* (2006.01)
(52) U.S. Cl. .................................. 708/250
(58) Field of Classification Search ......... 708/200–209, 708/250–256
See application file for complete search history.

(56) References Cited

U.S. PATENT DOCUMENTS

| | | | | |
|---|---|---|---|---|
| 3,582,882 | A * | 6/1971 | Titcomb et al. ............. | 708/256 |
| 3,961,169 | A | 6/1976 | Bishop et al. | |
| 4,176,399 | A | 11/1979 | Hoffmann et al. | |
| 4,853,884 | A | 8/1989 | Brown et al. | |
| 5,778,069 | A * | 7/1998 | Thomlinson et al. ........ | 708/250 |
| 6,369,727 | B1 | 4/2002 | Vincze | |
| 6,414,558 | B1 | 7/2002 | Ryan et al. | |
| 6,430,170 | B1 * | 8/2002 | Saints et al. ................ | 708/250 |
| 6,456,737 | B1 * | 9/2002 | Woodfill et al. ............. | 708/424 |
| 6,727,765 | B1 | 4/2004 | Ess | |
| 6,919,794 | B2 * | 7/2005 | Bardouillet et al. ...... | 340/146.2 |
| 2002/0080965 | A1 | 6/2002 | Marinet et al. | |
| 2002/0154767 | A1 * | 10/2002 | Endo et al. ..................... | 380/28 |
| 2003/0200239 | A1 | 10/2003 | Hars | |
| 2003/0219119 | A1 | 11/2003 | Kocarev et al. | |
| 2004/0096060 | A1 | 5/2004 | Henry et al. | |
| 2004/0263320 | A1 * | 12/2004 | Bardouillet et al. ...... | 340/146.2 |

OTHER PUBLICATIONS

French Search Report from French Patent Application No. 04/51325, filed Jun. 24, 2004.
Bucci, M. et al., "A High Speed Truly IC Random Number Source for Smart Card Microcontrollers", ICECS 2002, 9th IEEE International Conference on Electronics, Circuits and Systems, vol. 1, Sep. 15, 2002, pp. 239-242, XP010611765 Piscataway, NJ, US.
Takeuchi, S, et al., "High Performance Random Pulser Based on Photon Counting", IEEE Transactions on Nuclear Scient, IEEE Inc., NY, US, vol. NS-33, No. 1, Feb. 1, 1986, pp. 946-949, XP002022448 ISSN: 0018-9499.
Search Report from French Patent Application No. 04/51324, filed Jun. 24, 2004.

* cited by examiner

*Primary Examiner*—Chat C Do
(74) *Attorney, Agent, or Firm*—Lisa K. Jorgenson; James H. Morris; Wolf, Greenfield & Sacks, P.C.

(57) ABSTRACT

A method and a circuit for detecting a possible loss of the equiprobable character of a first output bit flow originating from at least one first normalization element of an initial bit flow, consisting of submitting the initial flow to at least one second normalization element of a nature different from the first one, pairing, bit to bit, the flows originating from the two elements, and checking the equidistribution of the different state pairs.

13 Claims, 1 Drawing Sheet

CHECKING OF A BIT FLOW

BACKGROUND OF THE INVENTION

1. Field of the Invention

The present invention relates to the field of random number generators and more specifically generators of random numbers in the form of bit flows originating from one or several digital or digitized noise sources.

2. Discussion of the Related Art

FIG. 1 very schematically shows in the form of blocks an example of a bit flow generator to which the present invention applies.

Such a generator is based on the use of a noise source 1 (NS) providing an analog noise to an analog-to-digital conversion element 2 (A/D) clocked for example by a clock CLK and providing a bit flow BS. Source 1 is for example formed of one or several oscillators having their outputs summed up to provide an analog noise to the input of converter 2. Converter 2 may in simplified manner be an inverter associated with a flip-flop.

The quality of a random generator or more generally of a noise source is measured by the quality of its random character, which results in the equiprobability of the provided symbols, for example, the equiprobability of 0 and of 1 in the case where the source is considered bit by bit.

In practice, there may be a risk that the bit flow BS provided by converter 2 does not have an equiprobable distribution of its elements (bits or bit words). In particular, noise source 1 generally uses oscillators which risk synchronizing, together or with clock CLK. In case of a synchronization, the output state (bit flow) is periodic.

To improve the equiprobable character of a bit flow supposed to be random, bit flow BS crosses a normalization circuit 3 (NORM) providing a modified bit train NBS and having an improved equidistribution of the 0s and is in the flow.

FIG. 2 shows a conventional example of a circuit 3 for normalizing a bit flow BS applying a so-called Von Neumann method. Such a circuit 3 is based on an analysis of incoming bit flow BS, by bit pairs. A storage element 4 (BUFF) enabling processing the bits, in pairs, in a state determination circuit 5 which provides normalized bit flow NBS, is then used. According to the Von Neumann method, if the bit pair is 1-0, a state 1 is generated. If the bit pair is 0-1, a state 0 is generated. If the bit pair is 0-0 or 1-1, it is ignored, that is, no state is output. Other normalization methods exist, may or may not apply the Von Neumann method.

A second example of normalization consists of calculating a parity bit over a predetermined length of the source and of only exploiting this parity bit. This method has been described in document RFC 1750 in December 1994.

In principle, the number of occurrences of 0 and 1 in flow BS is constant, which means that the noise source skew—or drift—is constant along time. Indeed, if this property is not respected on the noise source side, the normalization circuit does not have the expected effect of suppressing this drift in the bit flow.

The efficiency of a bit flow normalization circuit supposed to be random is particularly important since the random numbers are often used in ciphering applications or the like for which the loss of the random character of the number is a weakness.

A disadvantage of current normalized random number generators is that it is not known to check the elimination of a possible skew by the normalization circuit. This especially results from the fact that normalization methods only a priori assume, in their operation, that the noise source skew is constant.

A first problem is that if this skew becomes non constant, the bit flow provided by the normalization circuit no longer respects the desired equidistribution, without this being noticed.

A second problem is that an equidistribution over a great number of bits might be verified a posteriori at the output of a normalization circuit, but that it is not currently known to dynamically check this equiprobable character to rapidly detect a possible loss in the skew constancy in the noise source.

SUMMARY OF THE INVENTION

The present invention aims at checking the constancy of the skew of a bit flow provided by a normalization circuit and, in particular, at dynamically detecting a drift.

The present invention also aims at providing a solution compatible with conventional normalization methods and which, in particular, requires no modification of the actual random bit flow generation.

The present invention also aims at providing a simple implementation solution.

To achieve these and other objects, the present invention provides a circuit for generating a bit flow based on a noise source and on at least one first element for normalizing the initial bit flow provided by the noise source, comprising:

at least one second element of normalization of the same noise source, of a different nature than the first element; and means for pairing, bit to bit, the flows originating from the two elements; and means for checking the equidistribution of the four possible state pairs in the bit pairs, each formed of one bit of each element.

According to an embodiment of the present invention, the normalization elements are selected so that there exists, over two sets of bits of same size, at least one input value for which the two elements provide a different state, to within one bijective permutation.

According to an embodiment of the present invention, the respective outputs of the elements are sent to shift registers having sizes selected according to the flow rate difference between the two normalization elements.

According to an embodiment of the present invention, the means for checking the equidistribution comprise four counters of the respective occurrences of the four possible bit pairs.

According to an embodiment of the present invention, the circuit provides a bit for validating the equiprobable character of the bit flow as long as said pairs are equidistributed.

The present invention also provides a method for detecting a possible loss of the equiprobable character of a first output bit flow originating from at least one first element of normalization of an initial bit flow, comprising:

submitting the initial flow to at least one second normalization element of a nature different from the first one;

pairing, bit to bit, the flows originating from the two elements; and checking the equidistribution of different state pairs.

According to an embodiment of the present invention, the normalization elements are selected so that there exists, over two sets of bits of same size, at least one input value for which the two elements provide a different state, to within one bijective permutation.

The foregoing and other objects, features, and advantages of the present invention will be discussed in detail in the following non-limiting description of specific embodiments in connection with the accompanying drawings.

DETAILED DESCRIPTION

Figure 1:
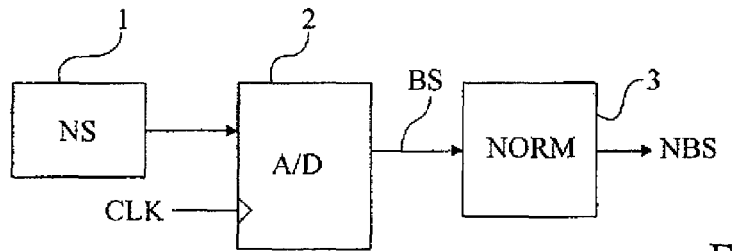
FIGS. 1 and 2, previously described, are intended to show the state of the art and the problem to solve.
Figure 2:
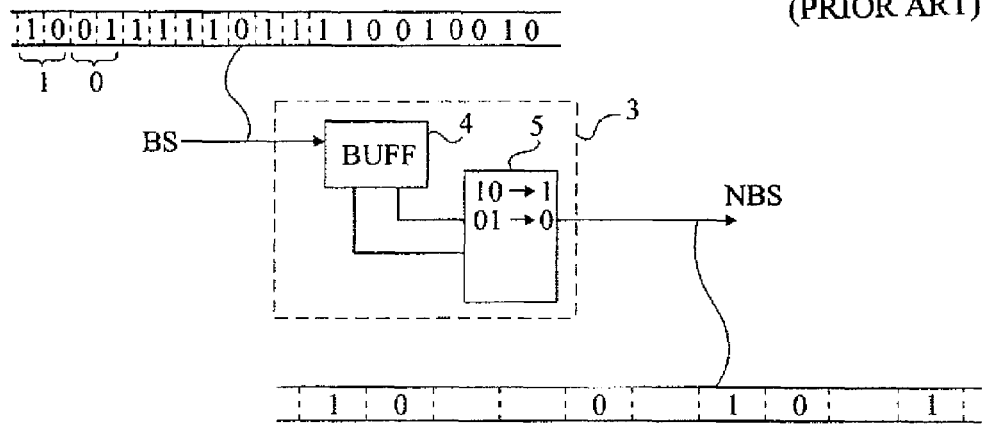

The same elements have been designated with the same reference numerals in the different drawings. For clarity, only those elements which are necessary to the understanding of the present invention have been shown in the drawings and will be described hereafter. In particular, the details constitutive of the normalization circuits, of the analog-to-digital converters, and of the noise source have not been discussed, the present invention being compatible with any conventional implementation.

According to the present invention, the equiprobable character of the bit flow provided by a normalization circuit is validated, by checking the respective numbers of different bit pairs (00, 11, 10, and 01) obtained by pairing, bit to bit, this flow and that generated by another parallel normalization circuit. In other words, it is provided to have the bit flow provided by an analog-to-digital converter processed by two normalization circuits in parallel, then to pair the bits provided by these two flows, to check that the skew of the input noise source is effectively constant. In fact, this amounts to checking the equidistribution of states 11, 00, 01, and 10 in the pairs resulting from the pairing of the two bit flows.

According to the present invention, the two normalization circuits are selected to be different from each other, that is, so that the two circuits provide, for a same input flow, two output flows different from each other. According to the present invention, two normalization circuits are of different nature with respect to each other if there exists, over two sets of the same size, at least one input value for which the two circuits provide a different state, to within one bijective permutation.

Figure 3:
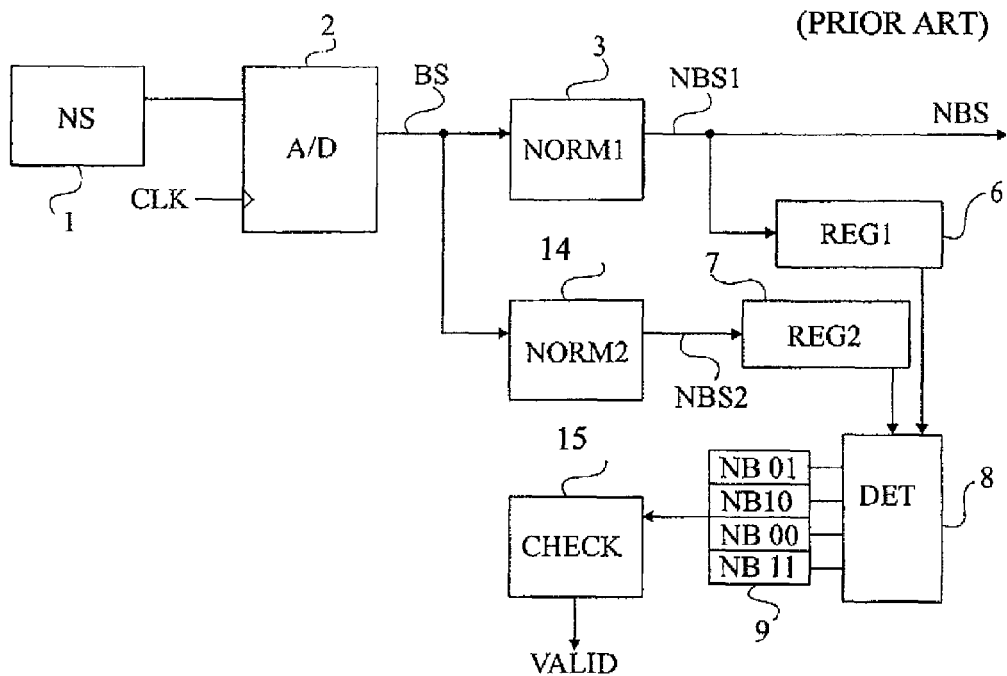
FIG. 3 very schematically shows in the form of blocks an embodiment of a circuit for validating the random character of a bit flow according to the present invention.

FIG. 3 very schematically shows in the form of blocks an embodiment of a circuit for generating a random bit flow implementing the present invention.

As previously, a noise source 1 (NS), for example, analog, provides a converter 2 (A/D) with an analog signal which, by being for example sampled by a clock signal CLK, becomes a bit train BS.

According to this embodiment of the present invention, flow BS is sent, in parallel, onto a first normalization circuit 3 (NORM 1) providing a first normalized bit flow NBS1 and onto a second normalization circuit 14 (NORM2) providing a second normalized bit flow NBS2.

Normalization circuits 3 and 14 may implement any conventional normalization method (Von Neumann or other) provided to be of a different nature in the sense of the present invention. However, they may indifferently have identical or different flow rates.

For example, a first normalization element processes the bits by pairs and provides a 1 for each pair 1-0 and a 0 for each pair 0-1 without changing the states of the other pairs. A second normalization element processes the bits by triplets and provides a 1 for each triplet 1-0-1 and a 0 for each triplet 0-1-1 without changing the states of the other triplets. In this case, the elements have different flow rates.

According to another example where the circuits have identical flow rates, a first normalization element processes the bits of the incoming flow by successive pairs and combines them with an XOR function. A second element assigns, as in a Von Neumann normalizer, states 0 and 1 (or conversely) respectively to pairs 01 and 10, and upon occurrence of a double 00 or 11, a state 1 if the output bit determined by the preceding pair was 0 and a state 0 in the opposite case.

According to the present invention, the flows provided by the two elements 3 and 14 are temporarily memorized to enable their pairing. For example, flows NBS1 and NBS2 are sent into registers 6 and 7 (for example, shift registers REG1 and REG2). Each time elements 3 and 14 have provided a new bit in the flow, the two bits are paired (block 8, DET) and are compared with one of the four possible pairs (00, 01, 10, 11). Detector 8 then increments a counter (counters 9: NB00, NB01, NB10, NB11) assigned to the number of occurrences of each of the pairs. The values of counters 9 are periodically compared with one another (block 15, CHECK) to check that they do not move away from one another. Indeed, if the pairs are equidistributed, this means that the noise source has a constant skew. According to an example of embodiment, block 15 if provides a state bit VALID indicative of the equiprobable character of flows NBS1 and NBS2.

In practice, it is periodically checked that counters 9 have values which do not move away too much from one another, that is, which remain within a predetermined range considered as being acceptable. For example, on each comparison, the values of all counters are normalized with respect to the median value of the counters (which all have the same size) and it is considered that an overflow of any of the counters means a loss of the equiprobable character of the bit flow. The selection of the counter size depends on the size of the desired tolerance in the examination of the equidistribution and of the periodicity of the components.

The size of registers 6 and 7 depends on the average flow rate difference between elements 3 and 14.

If the flow rates of elements 6 and 7 are constant and identical, registers of one bit are sufficient.

If the mean flow rates are identical but non constant, registers 6 and 7 have identical sizes and must be able to store a number of bits corresponding to the maximum possible time shift in flows NBS1 and NBS2. Since the flow rates are identical, sometimes one, sometimes the other of registers 6 and 7 which will store the flow rate will have to wait for the other one for the pairing.

If the average flow rates are different from each other, it is still the same register 6 or 7 which is used to store the flow having to wait for the other. In this case, it is necessary to provide a periodic resetting of this register.

As an alternative, two counters per possible pair are used (a total of eight counters) and the incrementation of a counter is started when the other counter assigned to the same pair is at its median value. Each counter is reset when the other counter assigned to the same pair has taken over the occurrence counting.

If the occurrences of the pairs obtained by bit-to-bit pairing of the two flows remain distributed in balanced fashion (within the predetermined range), this means that the two normalization circuits modify input flow BS by maintaining the noise source skew constant and, accordingly, that any one of output bit flows NBS1 and NBS2 has an equiprobable character. In the example of FIG. 3, the flow of first normalizer NBS1 is that providing flow NBS of the random generator.

However, if noise source 1 has a non-constant skew, the two normalization circuits will modify the bit flow but, since they have different natures, without modifying the non-constant character of input flow BS. Accordingly, the distribution of the paired pairs of the two flows does not remain the same for each pair.

According to a first specific example of embodiment, a period of examination of counters 9 of 32 bits is provided.

The exploitation of the result of block 15 depends on the application. For example, if a counter overflows, the generated bit flow is not used since this means that it is not satisfactorily equidistributed.

Of course, the present invention is likely to have various alterations, modifications, and improvements which will readily occur to those skilled in the art. In particular, the selection of the normalization circuit to be used depends on the application which may condition the use of one normalization circuit type rather than another.

Further, the practical implementation of the present invention, be it by hardware and/or software means, is within the abilities of those skilled in the art based on the functional indications given hereabove.

Moreover, although the present invention has been described in relation with a Von Neumann type normalization circuit exploiting the bit pairs, it more generally applies whatever the length (even or odd) of the incoming words or flow sections considered by the normalization circuits. For example, the incoming bits may be processed four by four.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A circuit to check a bit flow derived from a noise source, the circuit comprising:
at least one first normalization circuit to change at least one value of the bit flow provided by the noise source, and to output a first modified output flow;
at least one second normalization circuit to change at least one value of the bit flow and to output a second modified output flow different from the first modified output flow;
means for pairing, bit to bit, the first modified output flow and the second modified output flow to provide a plurality of bit pairs, each bit pair formed of one bit of the first modified output flow and one bit of the second modified output flow; and
means for checking an equidistribution of multiple possible states of the plurality of bit pairs, and providing an indication of an equiprobable distribution of the first modified output flow and the second modified output flow based on the equidistribution of the multiple possible states.

2. The circuit of claim 1, wherein the at least one first normalization circuit and the at least one second normalization circuit are selected so that there exists, over two sets of bits of same size, at least one input value for which the at least one first normalization circuit and the at least one second normalization circuit provide a different state, to within one bijective permutation.

3. The circuit of claim 1, wherein the first modified output flow and the second modified output flow are sent to shift registers having sizes selected according to a flow rate difference between the at least one first normalization circuit and the at least one second normalization circuit.

4. The circuit of claim 1, wherein the means for checking an equidistribution comprise a counter for each of the respective occurrences of the multiple possible states of the plurality of bit pairs.

5. The circuit of claim 1, wherein the circuit provides a bit for the indication of an equiprobable distribution of the first modified output flow and the second modified output flow.

6. A method for detecting a possible loss of an equiprobable character of a first output bit flow, the method comprising:
submitting an initial bit flow to at least one first normalization circuit that changes at least one value of the initial bit flow to produce the first output bit flow;
submitting the initial flow to at least one second normalization circuit that changes at least one value of the initial bit flow to produce a second bit flow different from the first output bit flow;
pairing, bit to bit, the first output bit flow and the second bit flow to provide a plurality of bit pairs, each bit pair formed of one bit of the first output bit flow and one bit of the second bit flow;
checking an equidistribution of different possible states of the plurality of bit pairs; and
indicating an equiprobable distribution of the first output bit flow and the second bit flow based on the equidistribution of the different possible states.

7. The method of claim 6, wherein the at least one first normalization circuit and the at least one second normalization circuit are selected so that there exists, over two sets of bits of same size, at least one input value for which the at least one first normalization circuit and the at least one second normalization circuit provide a different state, to within one bijective permutation.

8. An apparatus, comprising:
a first normalization circuit to change at least one value of a bit flow derived from a noise source, the first normalization circuit outputting a first modified output flow;
a second normalization circuit to change at least one value of the bit flow and to output a second modified output flow different from the first modified output flow; and
a checking circuit coupled to the first normalization circuit and the second normalization circuit to provide an indication of a randomness of at least the first modified output flow.

9. The apparatus of claim 8, wherein the checking circuit further comprises:
a pairing circuit to provide a plurality of bit pairs, each bit pair formed of one bit of the first modified output flow and one bit of the second modified output flow.

10. The apparatus of claim 9, wherein the checking circuit is further configured to analyze multiple possible states of the plurality of bit pairs to provide the indication of a randomness of at least the first modified output flow.

11. The apparatus of claim 10, wherein the checking circuit further comprises:
a counter circuit comprising a counter for each of the multiple possible states of the plurality of bit pairs, the counter circuit configured to provide the indication of an equidistribution of multiple possible states of the plurality of bit pairs.

12. The apparatus of claim 8, wherein there exists, over two sets of bits of the same size, at least one input value for which the first normalization circuit and the second normalization circuit provide a different state, to within one bijective permutation.

13. The apparatus of claim 8, further comprising first and second shift registers to respectively receive the first modified output flow and the second modified output flow, the first and second shift registers having respective sizes selected according to a flow rate difference between the first modified output flow and the second modified output flow.

* * * * *